(12) United States Patent
Rozbicki et al.

(10) Patent No.: US 6,764,940 B1
(45) Date of Patent: Jul. 20, 2004

(54) METHOD FOR DEPOSITING A DIFFUSION BARRIER FOR COPPER INTERCONNECT APPLICATIONS

(75) Inventors: Robert Rozbicki, San Francisco, CA (US); Michal Danek, Cupertino, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/412,562

(22) Filed: Apr. 11, 2003

Related U.S. Application Data

(63) Continuation-in-part of application No. 09/965,472, filed on Sep. 26, 2001, now Pat. No. 6,607,977.
(60) Provisional application No. 60/275,803, filed on Mar. 13, 2001, and provisional application No. 60/379,874, filed on May 10, 2002.

(51) Int. Cl.[7] .......................................... H01L 21/4763
(52) U.S. Cl. ........................ 438/627; 438/637; 438/638; 438/643; 438/653; 438/687; 438/700; 438/720
(58) Field of Search ................................. 438/622, 625, 438/627, 634, 637–638, 643, 653, 687, 700, 702, 714, 719–720, 737–738, 724–725

(56) References Cited

U.S. PATENT DOCUMENTS

| | | |
|---|---|---|
| 5,221,449 A | 6/1993 | Colgan et al. |
| 5,281,485 A | 1/1994 | Colgan et al. |
| 5,482,611 A | 1/1996 | Helmer et al. |
| 5,985,762 A * | 11/1999 | Geffken et al. ............. 438/687 |
| 6,074,544 A | 6/2000 | Reid et al. |
| 6,080,285 A | 6/2000 | Liu et al. |
| 6,099,702 A | 8/2000 | Reid et al. |
| 6,110,346 A | 8/2000 | Reid et al. |
| 6,124,203 A | 9/2000 | Joo et al. |
| 6,126,798 A | 10/2000 | Reid et al. |
| 6,139,712 A | 10/2000 | Patton et al. |
| 6,156,167 A | 12/2000 | Patton et al. |
| 6,159,354 A | 12/2000 | Contolini et al. |
| 6,162,344 A | 12/2000 | Reid et al. |
| 6,179,973 B1 | 1/2001 | Lai et al. |
| 6,179,983 B1 | 1/2001 | Reid et al. |
| 6,193,854 B1 | 2/2001 | Lai et al. |
| 6,217,716 B1 | 4/2001 | Fai Lai |
| 6,221,757 B1 | 4/2001 | Schmidbauer et al. |
| 6,228,754 B1 | 5/2001 | Iacoponi et al. |
| 6,251,242 B1 | 6/2001 | Fu et al. |
| 6,274,008 B1 | 8/2001 | Gopalraja et al. |
| 6,277,249 B1 | 8/2001 | Gopalraja et al. |
| 6,287,977 B1 * | 9/2001 | Hashim et al. ............. 438/722 |
| 6,350,353 B2 | 2/2002 | Gopalraja et al. |
| 6,492,262 B2 * | 12/2002 | Uzoh ......................... 438/637 |
| 6,656,841 B1 * | 12/2003 | Kim ........................... 438/687 |

* cited by examiner

*Primary Examiner*—Lynne Gurley
(74) *Attorney, Agent, or Firm*—Beyer Weaver & Thomas, LLP

(57) ABSTRACT

Methods for forming a metal diffusion barrier on an integrated circuit include at least four operations. The first operation deposits barrier material via PVD, ALD or CVD to provide some minimal coverage. The second operation deposits an additional barrier material and simultaneously etches a portion of the barrier material deposited in the first operation. The third operation deposits barrier material via PVD, ALD or CVD to provide some minimal coverage especially over the bottoms of unlanded vias. The forth operation deposits a metal conductive layer. Controlled etching is used to selectively remove barrier material from the bottom of vias, either completely or partially, thus reducing the resistance of subsequently formed metal interconnects. In addition, techniques to protect the bottoms of the unlanded vias are described.

44 Claims, 10 Drawing Sheets

METHOD FOR DEPOSITING A DIFFUSION BARRIER FOR COPPER INTERCONNECT APPLICATIONS

CROSS-REFERENCE TO RELATED APPLICATIONS

This application is a continuation-in-part claiming priority under 35 USC 120 from U.S. patent application Ser. No. 09/965,472 filed Sep. 26, 2001 now U.S. Pat. No. 6,607,977, naming Rozbicki et al. as inventors, and titled "Method Of Depositing A Diffusion Barrier For Copper Interconnect Applications," which claims priority under 35 USC 119(e) from U.S. Provisional Patent Application No. 60/275,803 naming Danek as inventor, titled "Method of Depositing Barrier-Seed Layer on Semiconductor Substrates for Copper Interconnect Applications," filed Mar. 13, 2001; this application also claims priority under 35 USC 119(e) from U.S. Provisional Patent Application No. 60/379,874, filed May 10, 2002, naming Rozbicki and Danek as inventors, and titled "Method Of Depositing A Diffusion Barrier For Copper Interconnect Applications." Each of these references is incorporated herein by reference in its entirety for all purposes. This patent application is also related to U.S. patent application Ser. No. 09/862,539, titled "Improved Deposition of Conformal Copper Seed Layers by Control of Barrier Layer Morphology" filed by Suwwan de Felipe on May 21, 2001, and U.S. patent application Ser. No. 09/965,471, titled "Method of Depositing a Diffusion Barrier for Copper Interconnection Applications" filed by Suwwan de Felipe on Sep. 26, 2001. These patent applications, along with all other patent applications, patents and publications mentioned herein are incorporated by reference in their entirety for all purposes.

FIELD OF THE INVENTION

The present invention pertains to methods for forming a metal diffusion barrier on a partially fabricated integrated circuit. The methods employ at least one operation that selectively etches barrier material from the bottom of vias while simultaneously depositing barrier material on most regions of the integrated circuit. The methods are frequently performed on unlanded vias.

BACKGROUND OF THE INVENTION

Integrated circuit (IC) manufacturers have traditionally used aluminum and aluminum alloys, among other metals, as the conductive metal for integrated circuits. While copper has a greater conductivity than aluminum, it has not been used because of certain challenges it presents, including the fact that it readily diffuses into silicon oxide and degrades insulating electrical properties even at very low concentrations. Recently, however, IC manufacturers have been turning to copper because of its high conductivity and electromigration resistance, among other desirable properties. Most notable among the IC metalization processes that use copper is Damascene processing. Damascene processing is often a preferred method because it requires fewer processing steps than other methods and offers a higher yield. It is also particularly well suited to metals such as Cu that cannot readily be patterned by plasma etching.

Damascene processing is a method for forming interconnections on integrated circuits. It involves formation of inlaid metal lines in trenches and vias formed in a dielectric layer (inter-metal dielectric). In order to frame the context of this invention, a brief description of a copper dual Damascene process for forming a partially fabricated integrated circuit is described below. Note that the invention applies to other fabrication processes including single Damascene processes.

Presented in FIGS. 1A–1F, is a cross sectional depiction device structures created at various stages of a dual Damascene fabrication process. A cross sectional depiction of a completed structure created by the dual Damascene process is shown in FIG. 2. Referring to FIG. 1A, an example of a typical substrate, 100, used for dual Damascene fabrication is illustrated. Substrate 100 includes a pre-formed dielectric layer 103 (such as fluorine or carbon doped silicon dioxide or organic-containing low-k materials) with etched line paths (trenches and vias) in which a diffusion barrier 105 has been deposited followed by inlaying with copper conductive routes 107. Because copper or other mobile conductive material provides the conductive paths of the semiconductor wafer, the underlying silicon devices must be protected from metal ions (e.g., $Cu^{2+}$) that might otherwise diffuse or drift into the silicon. Suitable materials for diffusion barrier 105 include tantalum, tantalum nitride, tungsten, titanium tungsten, titanium nitride, tungsten nitride, and the like. In a typical process, barrier 105 is formed by a physical vapor deposition (PVD) process such as sputtering, a chemical vapor deposition (CVD) process, or an atomic layer deposition (ALD) process. Typical metals for the conductive routes are aluminum and copper. More frequently, copper serves as the metal in Damascene processes, as depicted in these figures. The resultant partially fabricated integrated circuit 100 is a representative substrate for subsequent Damascene processing, as depicted in FIGS. 1B–1F.

As depicted in FIG. 1B, a silicon nitride or silicon carbide diffusion barrier 109 is deposited to encapsulate conductive routes 107. Next, a first dielectric layer, 111, of a dual Damascene dielectric structure is deposited on diffusion barrier 109. This is followed by deposition of an etch-stop layer 113 (typically composed of silicon nitride or silicon carbide) on the first dielectric layer 111.

The process follows, as depicted in FIG. 1C, where a second dielectric layer 115 of the dual Damascene dielectric structure is deposited in a similar manner to the first dielectric layer 111, onto etch-stop layer 113. Deposition of an antireflective layer 117, typically a silicon oxynitride, follows.

The dual Damascene process continues, as depicted in FIGS. 1D–1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Next, as depicted in FIG. 1F, these newly formed vias and trenches are, as described above, coated with a diffusion barrier 123. As mentioned above, barrier 123 is made of tantalum, or other materials that effectively block diffusion of copper atoms into the dielectric layers.

After diffusion barrier 123 is deposited, a seed layer of copper is applied (typically a PVD process) to enable subsequent electrofilling of the features with copper inlay. FIG. 2 shows the completed dual Damascene process, in which copper conductive routes 125 are inlaid (seed layer not depicted) into the via and trench surfaces over barrier 123.

Copper routes 125 and 107 are now in electrical contact and form conductive pathways, as they are separated only by diffusion barrier 123, which is also somewhat conductive. Traditionally these diffusion barriers are deposited using PVD methods because of the high quality resultant films. However, when depositing in features with higher aspect ratios such as the narrow vias within modern technologies, PVD methods tend to produce films with poor sidewall coverage and thick bottom coverage. To produce films with improved step coverage in vias and trenches, CVD and ALD methods are being considered. However, the bulk resistivity of film using CVD and ALD methods tend to be high, resulting in a high via resistance or poor resistance distribution. Therefore, the common issue to using each of these methods is a high via resistance. In the case of CVD or ALD, it is due to the high bulk resistivity of the film (i.e. >1000 $\mu\Omega$ cm). In the case of PVD, it is due to high bottom coverage.

Thus, to reduce resistance between the copper routes, a portion of the diffusion barrier may be etched away, specifically at the via bottom, in order to expose the lower copper plug. This approach is generally described in U.S. Pat. No. 6,287,977 to Hashim et al., U.S. Pat. No. 5,985,762 to Geffken et al., and U.S. patent application Ser. No. 09/965,472 filed Sep. 26, 2001, incorporated by reference above. By completely etching away the barrier in the via bottom, the subsequent copper inlay can be deposited directly onto the lower copper line. Conventional methods for etching away diffusion barriers at the bottom of vias (for example, the region of barrier 127 contacting copper inlay 107 in FIG. 1F) are problematic in that they are not selective enough. That is, conventional etch methods remove barrier material from undesired areas as well, such as the corners (edges) of the via, trench, and field regions. This can destroy critical dimensions of the via and trench surfaces (faceting of the corners) and unnecessarily exposes the dielectric to plasma. This may lead to dielectric damage, such as critical dimension loss, increase in dielectric constant (with concomitant negative impact on device speed), and poor adhesion to the barrier layer. These problems will be encountered with the method described in the Geffken et al. patent.

Further, when etching through barrier layers and into the underlying copper metal, some copper oxide and etch residues (including polymeric etch residues) are sputtered onto the barrier sidewall. In the unlanded via case, dielectric material is sputtered along with the underlying copper metal onto the barrier side wall. Subsequently, when a copper seed layer is deposited, it forms directly on these contaminants. As a consequence, the copper seed layer may exhibit a myriad of problems, including poor adhesion, seed discontinuity, fill voiding, etc. Each of these problems negatively impact device performance, yield, and reliability. Such issues are expected with the method described in the Hashim et al. patent.

In addition, conventional etching methods do not address "unlanded" via regions typical of modem devices. In some cases these unlanded vias do not fully overlap with the underlying copper inlay 107. Such unlanded via is illustrated in FIG. 1F wherein a portion of diffusion barrier 123 is located at via bottom 127. In the unlanded via case, a portion of the barrier rests on copper inlay 107 and a portion rests on dielectric 103. A conventional barrier etch, meant to expose copper inlay 107, would expose both copper inlay 107 and dielectric 103 in region 127. If copper were to be deposited on such structure, it could diffuse directly into dielectric 103 through region 127. The Hashim et al. patent mentioned above does not also address this problem.

What are therefore needed are improved methods of forming diffusion barriers on integrated circuit structures, selective methods in which the diffusion barrier thickness is minimized at the bottoms of vias without sacrificing the integrity of the diffusion barrier in other regions. Preferably, this is accomplished in a manner that accounts for the special considerations of unlanded vias.

SUMMARY OF THE INVENTION

The present invention pertains to methods for forming a metal diffusion barrier on an integrated circuit. It provides a continuous, relatively thin barrier coverage at via bottoms for good reliability (even when unlanded vias are used) and low via resistance. The invention also provides a sufficiently thick barrier coverage on via sidewalls to address reliability issues such as stress migration and electromigration resistance. By selectively etching at the via bottoms, and not necessarily elsewhere, the invention also minimizes corner "blow-out" and faceting of vias without changing in feature critical dimensions. Still further, the invention minimizes copper contamination during wafer manufacturing processes and preserves properties of inter-level dielectrics by eliminating or minimizing direct plasma exposure. In general, methods of this invention lower wafer manufacturing costs by increasing yield.

The present invention pertains to various methods for forming a diffusion barrier. When integrated with a seed layer deposition operation, the method typically includes at least four operations. The first operation deposits barrier material via PVD, CVD or ALD to provide some minimal coverage. The second operation deposits an additional barrier material and simultaneously etches a portion of the barrier material deposited in the first operation. In cases in which unlanded vias may exist (and in some instances in which unlanded vias do not exist), a third operation is performed wherein at least a small amount of a barrier material is deposited over at least the bottoms of the vias to protect the dielectric material of the previous interconnect layer. The third operation uses at least one of PVD, CVD or ALD techniques. Typically, the barrier material deposited in the third operation covers at least the lower sidewalls of the vias (in addition to the via bottoms) and provides a high quality template on which to deposit a subsequent metal conductive layer. In some embodiments, at least part of the second operation is performed in the same processing chamber as the third operation. The forth operation deposits a metal conductive layer over the substrate to form a conductive route to the next metalization layer. In preferred embodiments of the invention, all four operations are done in a single process tool without breaking vacuum. In some embodiments, an additional operation is performed between the third and forth operation. This operation deposits another portion of barrier material and simultaneously etches a portion of the barrier material deposited in the third operation.

In preferred embodiments of the invention, a degas operation is performed prior to the first operation. The purpose of the degas operation is to remove unwanted moisture and hydrocarbon etch residue that may exist on the wafer. The degas operation can be performed by heating the wafer to between about 200 to 400 degrees Celsius, for example, depending on the type of dielectric and other materials in the device.

The result of the operations is a metal diffusion barrier formed in part by net etching in certain areas, in particular the bottom of vias, and a net deposition in other areas, in particular the sidewalls of vias. Controlled etching is used to selectively remove barrier material from the bottom of vias, either completely or partially, thus reducing the resistance of subsequently formed metal interconnects. In a preferred embodiment of the invention, selective etching is also used to remove contaminants under the barrier material, thus obviating a separate preclean operation before the first operation. In alternative embodiments, the preclean operation is performed before the first operation.

The invention accomplishes simultaneous etch and deposition by creation of defined plasma producing process conditions such that barrier material is etched away in some regions while in other regions diffusion barrier material is deposited. This is the second of the four operations described previously. The descriptive term "etch to deposition ratio" or "E/D" is used herein to characterize process conditions at any position on substrate. More specifically, in the context of a partially fabricated integrated circuit having via and trench surface features, methods described herein provide that E/D varies as a function of the elevation profile of the surface features to which the plasma is applied. Generally, E/D is greatest at the bottommost regions of the wafer surface features and decreases in magnitude as elevation increases. At a position where there is no net gain or loss of material, the etch and deposition processes equal each other and the E/D is 1. So preferably, the E/D is greater than 1 at the via bottom, but may be less than 1 on the trench step and on the field region.

A preferred diffusion barrier material for this etch/deposition sputter is tantalum, although the invention is not limited to tantalum. Other materials for which the invention is applicable include but are not limited to tungsten, cobalt, solid solutions (interstitial forms) of tantalum and nitrogen and binary nitrides (e.g. $TaN_x$, TiN, $WN_x$). After diffusion barriers of the invention are formed, a metal conductive layer is deposited thereon.

Preferably methods of the invention are used in Damascene processing in which the metal conductive layer and interconnects are made of copper. In some preferred methods of the invention, the metal conductive layer is a copper seed layer. Preferably seed layers of the invention are formed using PVD, but the invention is not limited in this way. As mentioned, in some methods of the invention, all aspects of a process flow for forming a diffusion barrier and depositing a metal conductive route thereon are done in the same processing tool. While a preferred conductive metal material for this deposition is copper, the invention is not limited to copper. Other materials for which the invention is applicable include aluminum and conductive alloys of aluminum or copper.

Methods of the invention create diffusion barriers having stack structures. Distinct portions of each stack may be deposited (layered) using PVD, CVD, ALD or other methods. Thus diffusion barriers of the invention may have monolayered, bilayered, trilayered or multilayered structures. Preferably, the portions include at least one of tantalum, nitrogen-doped tantalum, tantalum nitride, and titanium silicon nitride. More detail of preferred arrangements for the layering of these materials, methods of depositing, and structure of the diffusion barriers formed therefrom, will be described in the detailed description below.

Methods of the invention create diffusion barriers within integrated circuitry using at least the materials described above. Therefore, another aspect of the invention pertains to an integrated circuit or a partially fabricated integrated circuit. Preferably integrated circuits or partially fabricated integrated circuits of the invention include a diffusion barrier which covers all surfaces of a plurality of vias and a plurality of trenches with minimal diffusion barrier material at the bottom of the plurality of vias, and a metal conductive layer provided thereon, such that the diffusion barrier provides relatively little resistance to electrical conduction between the metal conductive layer and the plurality of metal conductive routes at the bottom of the plurality of vias.

A diffusion barrier which covers all surfaces of a plurality of vias and a plurality of trenches, said diffusion barrier having a thickness of between about 50 and 400 Å on said surfaces except at the bottom of the plurality of vias where there is less than about 50 Å of diffusion barrier material; and a metal conductive layer provided thereon.

These and other features and advantages of the present invention will be described in more detail below with reference to the associated drawings.

DETAILED DESCRIPTION OF PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the term "wafer" will be used interchangeably with "partially fabricated integrated circuit." One skilled in the art would understand that the term "partially fabricated integrated circuit" can refer to a silicon wafer during any of many stages of integrated circuit fabrication thereon. Thus, "wafer", "wafer substrate", and "substrate" are all used interchangeably.

Figure 3A:
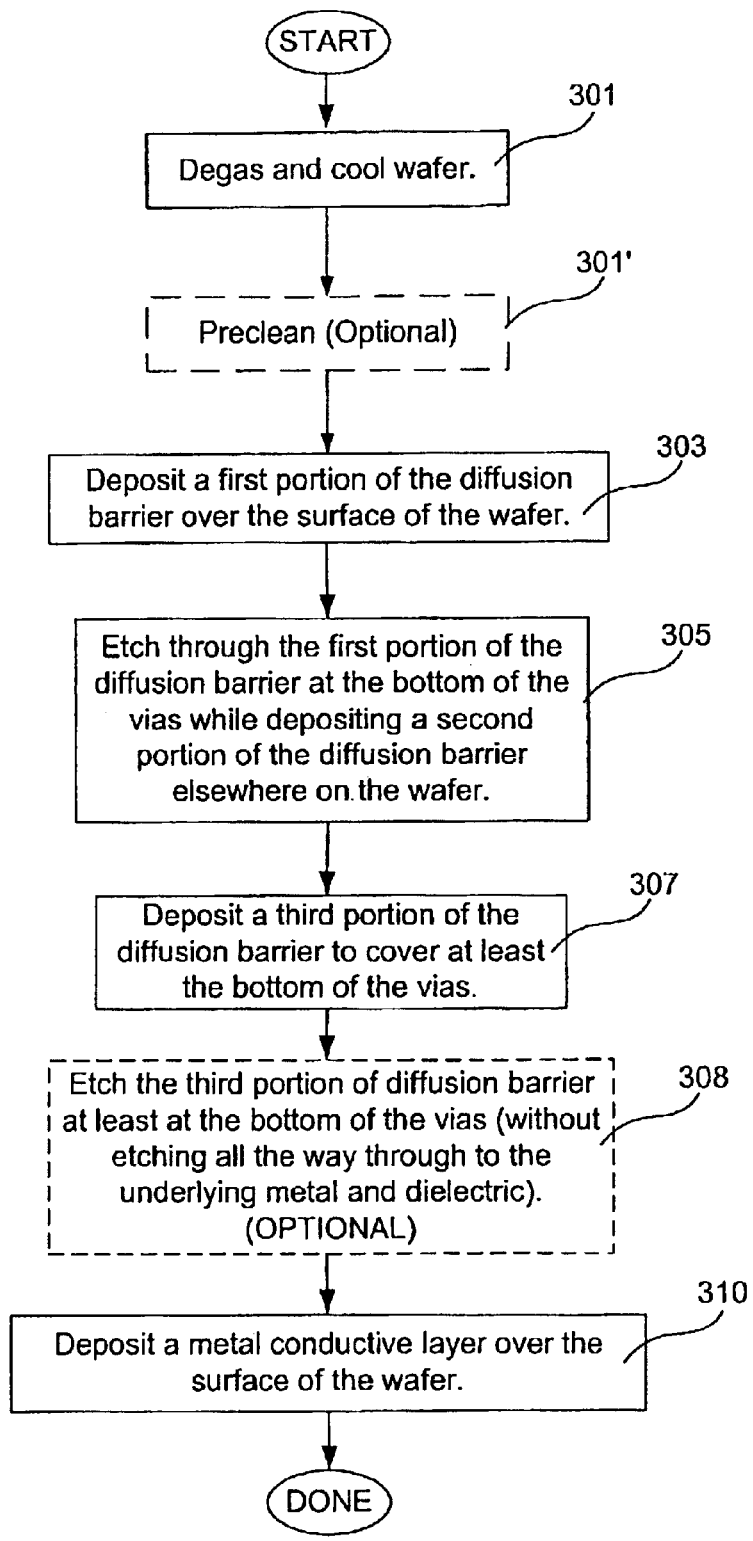
FIG. 3A presents aspects of methods for forming a diffusion barrier on a partially fabricated integrated circuit containing unlanded vias.

As mentioned, the invention finds particular use in Damascene processing. More particularly, the invention is useful in applications in which a diffusion barrier is deposited on partially fabricated integrated circuits that contain unlanded vias to prevent copper diffusion into surrounding dielectric material. FIG. 3A presents aspects of a process flow for forming diffusion barriers in wafers that contain unlanded vias. Typically, the process flows are performed in the context of copper Damascene processing. One can refer back to FIGS. 1A–1F for a slightly broader context.

Figure 1A:
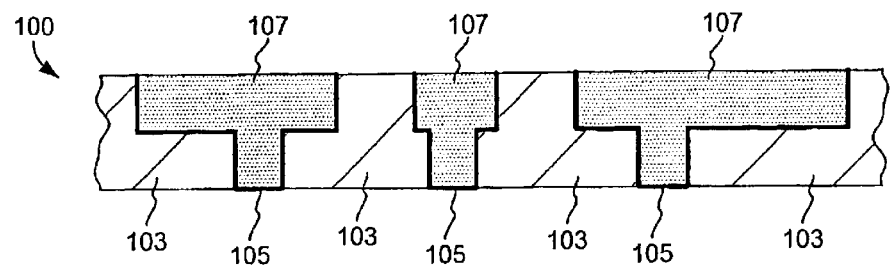
FIGS. 1A–1F show cross sectional depictions of device structures created during a copper dual Damascene fabrication process.
Figure 1B:
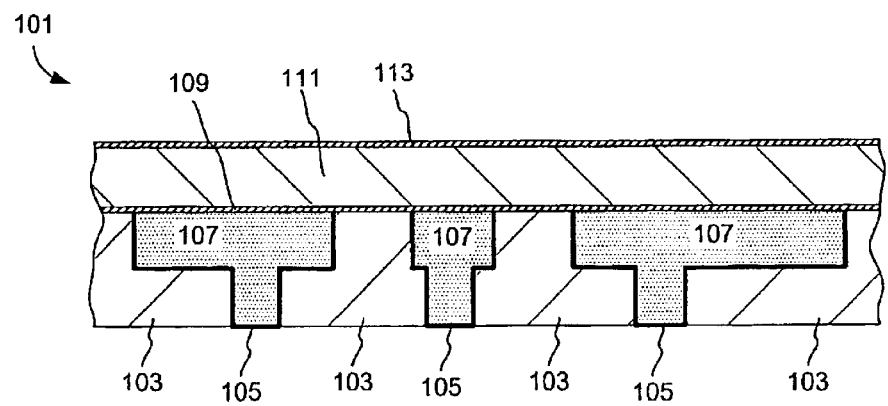
Figure 1C:
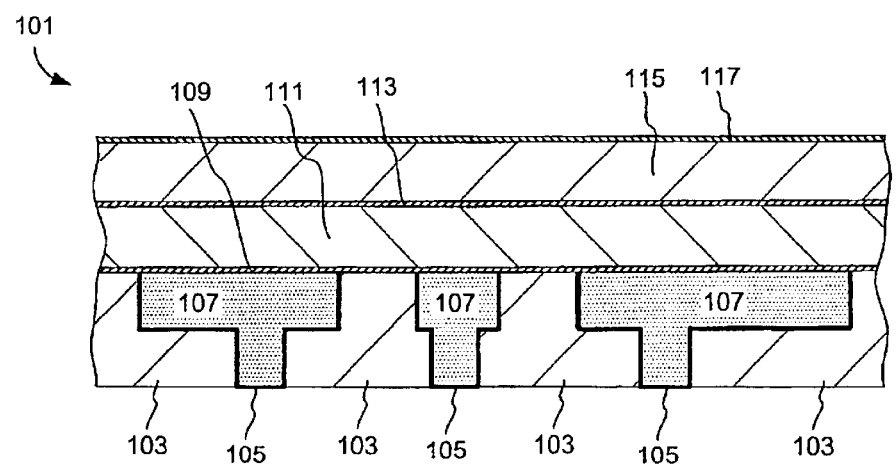
Figure 1D:
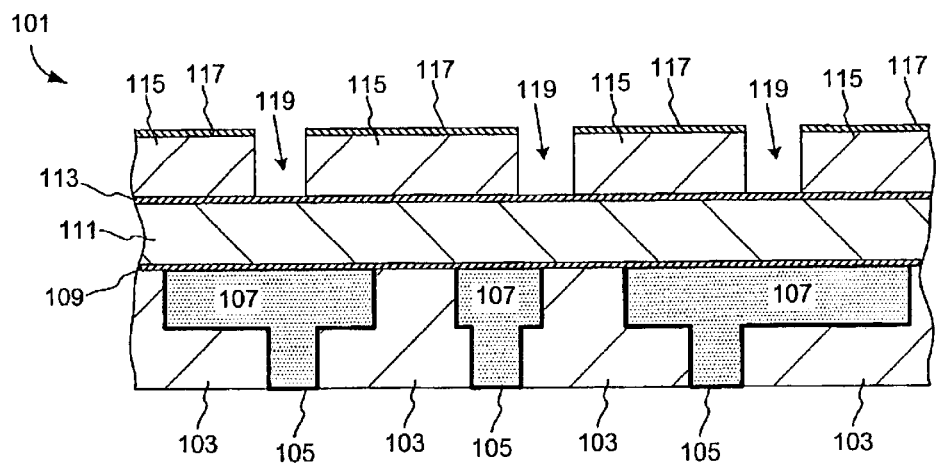
Figure 1E:
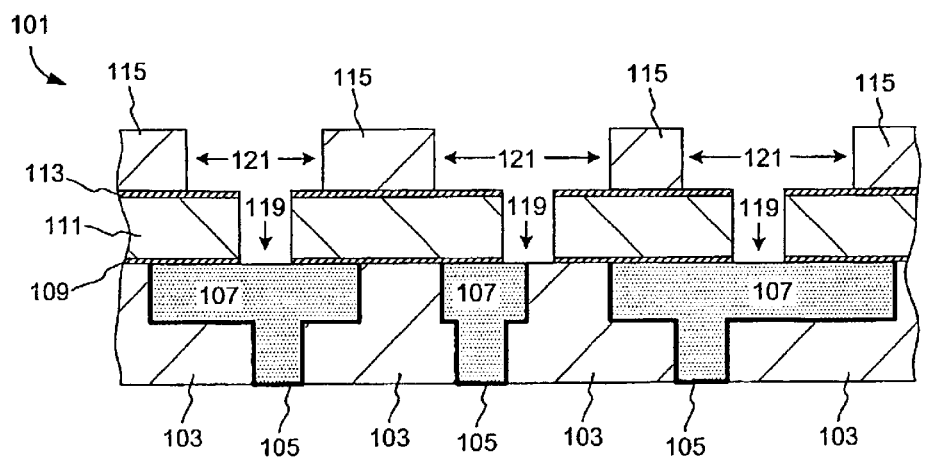
Figure 1F:
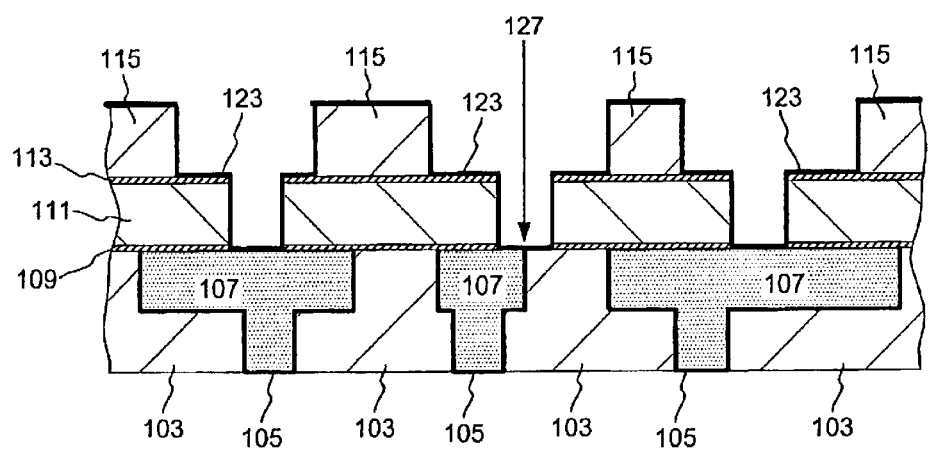
Figure 2:
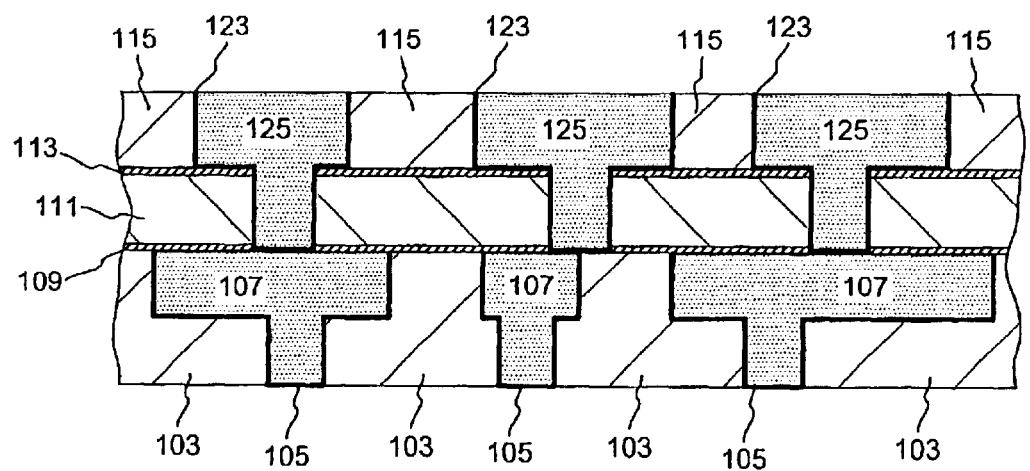
FIG. 2 shows a cross sectional depiction of a two metal levels in a device created using the copper dual Damascene process of FIGS. 1A–1F.

Specifically, referring to FIG. 1E, once vias and trenches have been formed in a wafer, typically a diffusion barrier will be formed thereon. For wafer substrates having vias that are entirely landed over underlying metal surfaces, methods that etch through barrier material at the bottom of vias may be used. These methods were referred to previously in the background section. Since the majority of wafer substrates will have unlanded vias (as discussed in the background section in reference to FIG. 1F), the methods of the present invention address cases in which unlanded vias exist. These methods provide for a minimal amount of barrier material at the bottom of the vias and lower sidewalls so the copper diffusion and copper seed contamination issues described earlier can be avoided.

A method of forming diffusion barriers of the invention intended primarily, but not exclusively, for unlanded vias, will now be described with reference to the flow chart of FIG. 3A and associated schematic diagrams in FIGS. 3B–3H. Note that in many embodiments, each of the depicted process operations is carried out using process conditions and materials specific to a particular desired outcome. The invention is not limited to these specific embodiments, but rather they are intended to illustrate the invention.

Referring to FIG. 3A, aspects of a process flow for forming a diffusion barrier of the invention are depicted. According to process block 301, first the wafer is heated under vacuum to degas the wafer surface of contaminants such as water and volatile hydrocarbons from the etch residue of the previous process. The wafer is then transferred to another chamber where it is cooled in such a manner as to not allow condensation and recontamination. Suitable chamber temperatures for the degassing process range from about 200 to 400 degrees Celsius, more preferably around 300 degrees Celsius. The cooling process is typically done at room temperature or below.

Preferably, the methods of this invention are performed without using a preclean step. Experimental evidence (see EXPERIMENTAL section) has shown that the process operations depicted in FIG. 3A are sufficient to provide a diffusion barrier substantially free of the deleterious contaminants that precleaning is intended to remove. Nevertheless, some alternative embodiments of the invention allow for a preclean operation 301' in addition to the degassing process step 301 of FIG. 3A. This preclean step typically involves implementing a sputter etch or reactive clean process using gas mixtures of argon and hydrogen or nitrogen and hydrogen, or oxygen containing mixtures. If this preclean process is used, it is preferable that the degassing and preclean processes be done in separate chambers to avoid contamination after the preclean step. In preferred embodiments, the simultaneous etch/deposition (as described below) is used to remove surface contaminants from the via bottom by etching through a barrier material thereon. In this way, the barrier is removed only at the via bottom and the exposed copper is effectively cleaned by exposure to the plasma, thereby eliminating the need for a preclean step. Contaminants include residues left from etch and photoresist clean processes and oxides of copper in some instances. The elimination of a preclean step provides various advantages. For example, during the preclean step, copper can sputter onto the walls of the vias, which, after subsequent process steps, can lead to copper that is trapped between the dielectric material and the diffusion barrier material on the via walls. In addition, sputter precleaning can widen trench openings thereby preventing critical dimensions from being realized. Precleaning can also increase the dielectric constant of low-k dielectrics by extracting carbon from the dielectric matrix (due to reaction with hydrogen). And, typically, precleaning requires a separate process chamber, thereby increasing the process complexity.

Figure 3B:
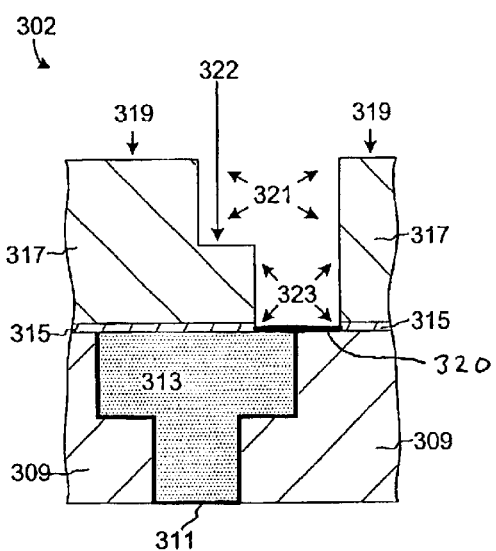
FIGS. 3B–E are cross-sectional depictions of an unlanded via that illustrate various aspects of a process flow for forming a diffusion barrier on an unlanded via as described in FIG. 3A.

Referring to FIG. 3B, a typical substrate with an unlanded via, 302, is illustrated. Substrate 302 includes a pre-formed dielectric layer 309 (such as fluorine or carbon doped silicon dioxide, porous silicon dioxide, or organic-containing low-k materials) with etched line paths (trenches and vias) in which a diffusion barrier 311 has been deposited followed by inlaying with copper conductive route 313. A silicon nitride or silicon carbide barrier layer 315 was laid thereon, followed by another layer of dielectric material, 317. After process steps (including lithography) for example as outlined in the background section above, dielectric layer 317 has etched trench 321 and via 323. Note that included in this surface feature are horizontal surfaces (field 319, step 322 of trench 321, and the bottom of via 323) and vertical surfaces (the side walls of the via and trench). As shown, some debris 320, such as copper oxide and etch residue, typically exists at the bottom of via 323. Since via 323 is unlanded, the surface area at the bottom of via 323 includes a portion of exposed copper conductive route 313 and a portion of exposed dielectric 309.

As described previously, the exposure of the dielectric layer 309 is undesirable since subsequent deposition of copper into the trench 321 and via 323 regions will allow for direct copper-dielectic contact, thereby allowing copper to diffuse through the dielectric layer 309 in later wafer processing and causing electrical leakages. To prevent direct copper-dielectric contact in this via region 323, it is preferred to cover the exposed dielectric layer 309 with barrier material before copper deposition. Methods to achieve this will be discussed shortly.

Referring back to FIG. 3A, the next block in the process flow involves depositing a first portion of the diffusion barrier over the surface of the wafer. See 303. Deposition of the first portion of the diffusion barrier may be done using PVD, CVD or ALD. Preferably, the first portion of the diffusion barrier includes at least one of tantalum, nitrogen-doped tantalum, tantalum nitride, and titanium silicon nitride. Tantalum, nitrogen-doped tantalum, and tantalum nitride are preferably deposited using PVD. As mentioned, other materials for which the invention is applicable include but are not limited to tungsten, cobalt, and other refractory nitrides (e.g. TiN, $WN_x$). These materials would also preferably be deposited by PVD. Suitable DC power for the PVD sputter target range between about 10 and 50 kW when not significantly biasing the wafer, with a preferred DC power range between about 15 and 30 kW. Titanium silicon nitride is preferably deposited using CVD or ALD. If deposited by PVD, suitable thicknesses for the first portion of barrier material range between about 10 and 400 angstroms, preferably between about 50 and 200 angstroms, as measured over field regions on the surface of the wafer. If deposited by CVD or ALD, the thicknesses of the barrier material range between about 10 and 100 angstroms, preferably between about 15 and 50 angstroms, as measured over the field regions on the surface of the wafer.

Figure 3C:
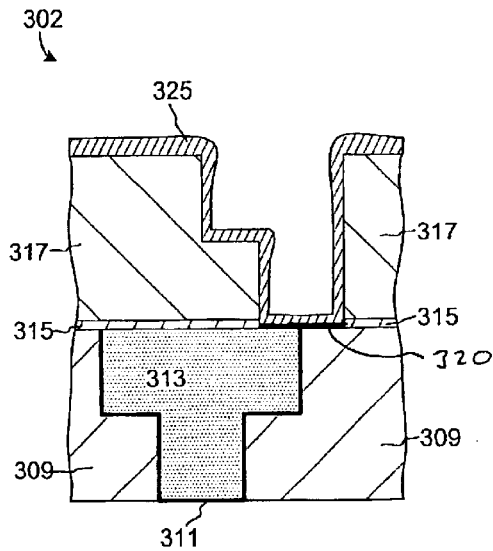

FIG. 3C depicts substrate 302, after deposition of the first portion of the diffusion barrier. In this example the first portion is a monolayer 325 that covers all surfaces of substrate 302. Preferably, the monolayer is between about 10 and 400 angstroms thick on the field of the wafer, more preferably between about 50 and 200 angstroms thick. Note that debris 320 remains at the bottom of the via.

Note that the term "monolayer" is meant to mean a single layer of material, not necessarily a single atomic or molecular layer as the term is sometimes used. In some embodiments, a bilayer or a trilayer is preferred for the first, second, third or subsequent portions of diffusion barrier material. The invention is not limited to deposition of a particular number of layers. Essentially any thickness of diffusion barrier material may be deposited: fractional layers, monolayers, bilayers, trilayers, etc. Note that PVD methods in general will often provide less conformal barrier layer coverage compared to CVD and ALD methods. FIGS. 3C–3H depict a more conformal barrier layer deposition, more representative of a CVD or ALD methods. Since preferred methods typically employ PVD, the resulting barrier layers in these cases may be less conformal than depicted in FIGS. 3C–3H.

Referring back to FIG. 3A, once the first portion of the diffusion barrier is deposited, simultaneous etch/deposition is used to etch through the first portion of the diffusion barrier at the bottom of the vias while depositing a second portion of the diffusion barrier elsewhere on the wafer. See 305. Preferably the second portion of the diffusion barrier is a sputtered metal. Even more preferably, the sputtered metal is tantalum.

Figure 3D:
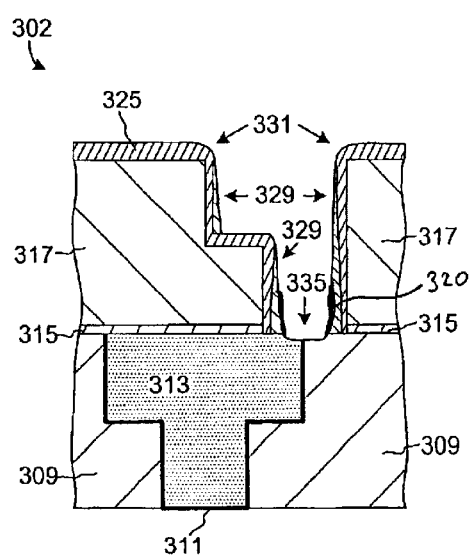

FIG. 3D depicts substrate 302 after such an etch/deposition process in which the etch to deposition ratio was greater than 1, both in the bottom of via 323 and on the horizontal surfaces (field 319 and step 322 (see FIG. 3B)). The relative rate of etch was controlled such that step 322 and field 319 were minimally etched relative to the bottom of via 323. Thus, the first portion 325 is etched through at the bottom of via 323, exposing the surface of the copper conductive route 313 and the surface of the dielectric layer 309. See 335. Concurrent with the etch, barrier material 329 (the second portion) is deposited on the sidewalls of the via and trench. Preferably, the second portion will have between about 25 and 100 Å of barrier material. Thus, the resulting structure 302 has a diffusion barrier (bilayer) that includes continuous first portion 325 and discontinuous second portion 329. Note that etching at the bottom of the via has redistributed residue 320 to the lower sidewalls of the via. See residue 320'.

Referring back to FIG. 3D, the second portion of the barrier layer is deposited only on the sidewalls of the surface features of substrate 302. As mentioned, some methods of the invention use etch to deposition ratios greater than one at the via bottom, but less than one on the field and trench regions. In this case, the second portion of barrier material will be deposited on the field and trench as well as the sidewalls. Preferably, the second portion has between about 0 and 100 Å of barrier material deposited on the field and horizontal trench surfaces. It is generally desirable to minimize the thickness of the material to reduce CMP costs in later wafer production processes.

Referring again to FIG. 3A, once the first portion of the diffusion barrier is etched through at the bottoms of the vias and a second portion of diffusion barrier is simultaneously deposited, a third portion of barrier material is deposited to once again cover the exposed dielectric material at the bottoms of the vias and any contamination (sputtered copper, copper oxide, etch residue, and/or sputtered dielectric) on the lower via side wall. See 307. The purpose of this deposition is to cover the surface of the underlying dielectric layer that was exposed during the etch of the previous step as well as cover any contamination that exists at the lower side wall to avoid the seed contamination issues described earlier. The amount of barrier material at the bottoms of the vias is preferably minimal so as to minimize the resistance between the underlying copper conductive route and subsequently deposited copper conductor. Deposition of this third portion of barrier material can be carried out using conventional PVD, CVD or ALD techniques as described above for deposition of the first portion of the barrier layer. Since it is not feasible to accurately measure the thickness of barrier material at the bottoms of vias using current technology, the thickness of the field regions after the deposition is typically used as reference points. If deposited by PVD, this thickness is between about 10 and 400 angstroms, preferably between about 50 and 200 angstroms as measured at the field regions of the wafer. If deposited by CVD or ALD, the field thickness is between 10 and 50 Å. In both cases the field thickness is selected to obtain between about 10 and 50 angstroms of diffusion barrier material in the via bottoms.

Figure 3E:
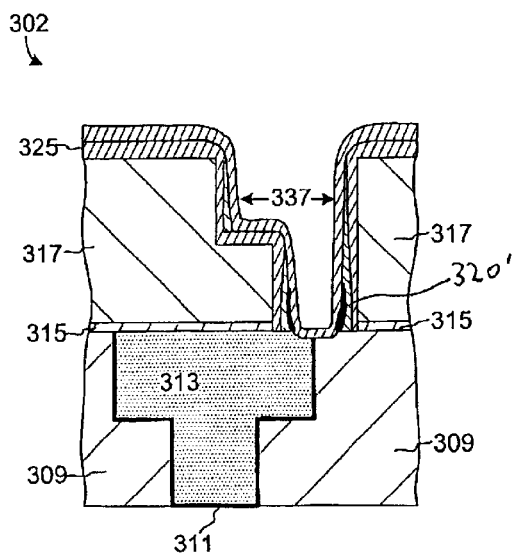

FIG. 3E, depicts substrate 302, after deposition of the third portion of barrier layer. In this example the third portion is a monolayer 337 that covers all surfaces of the substrate 302. As with the previously deposited barrier deposition (the first portion), the monolayer is preferably between about 10 and 400 angstroms thick on the field of the wafer, more preferably about 50 to 200 angstroms thick. Note that the result of this deposition is barrier layer coverage of the surfaces of both the underlying dielectric layer 309 and the copper conductive route 313. Hence, the subsequently deposited copper seed layer is prevented from contacting the dielectric layer.

Note that layer 337 will cover and immobilize any residues 320' sputtered onto the via sidewall from the underlying copper layer 313 or dielectric 309 during etching operation 305. As indicated above, such residues are known to interfere with subsequent deposition of copper seed layers onto the via sidewall, resulting in poor adhesion, seed discontinuity, and fill voiding. By encapsulating such residues 320' under layer 337, these problems are eliminated or mitigated.

Referring back to FIG. 3A, the next block in the process flow is an optional process involving the etching of the third portion of the diffusion barrier without etching all the way through to the underlying metal and dielectric layers. See 308. If, for instance, the third portion of the barrier layer was deposited too thickly, this process removes some of the barrier layer at the bottom of the via. This process is similar to the process of block 305 in that some barrier layer will simultaneously be deposited elsewhere on the wafer. However, since the sidewalls of the vias are nominally already sufficiently covered by the first, second and third portions of barrier layer, sidewall coverage may be less significant. Of course, any number of subsequent barrier material deposition and/or etch steps may be added until a desired final via bottom barrier material thickness is achieved.

Figure 3F:
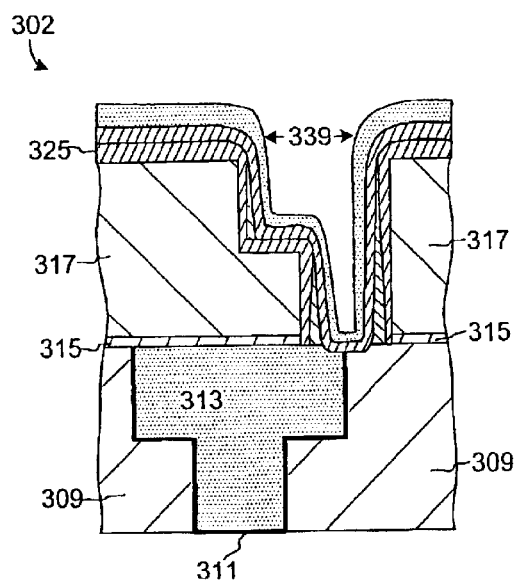
FIG. 3F is a cross-sectional depiction of the unlanded via of FIGS. 3B–E, further processed by depositing a copper layer over the unlanded via as described in FIG. 3A.
Figure 3G:
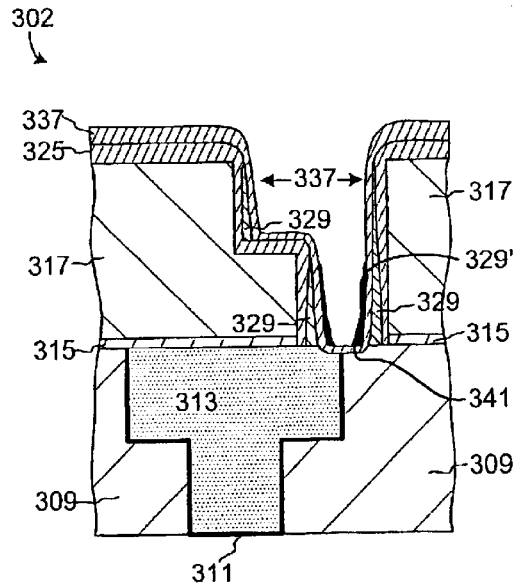
FIG. 3G is a cross-sectional depiction of another unlanded via similar to the unlanded via of FIGS. 3B–E, further processed using the optional partial etching through the third portion as described in FIG. 3A.

FIG. 3G depicts a substrate 302 after optional etch/deposition process 308. As with the previous etch/deposition process (305), the rate of etch was controlled such that at least the bottom of via 323 is etched to leave a minimal amount of barrier material 341. Concurrent with the etch, barrier material 337 may be deposited on the sidewalls of the via and trench. See region 329'.

The etch/deposition processes described in process blocks 305 and 308 of FIG. 3A are preferably carried out using RF re-sputtering techniques. For example, one method using this technique includes sputtering a metal from target having an applied DC power of between about 1 and 30 kW while applying a RF bias to the wafer substrate. Suitable wafer substrate biases range between about 100 and 2000 Watts, preferably 200–200 Watts. Note that the choice of DC and RF power depends on the substrate size, thus the wide range in power. A preferable carrier gas for the RF re-sputtering technique is argon, however, other gases such as $N_2$, Ne and Xe can also be used. Suitable gas flow rate range between about 50 and 300 sccm.

Figure 3H:
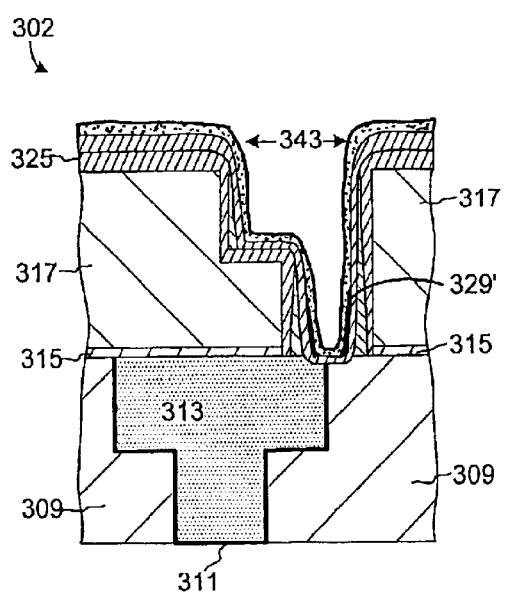
FIG. 3H is a cross-sectional depiction of the unlanded via of FIGS. 3G, further processed by depositing a copper layer over the unlanded via as described in FIG. 3A.

Referring again to FIG. 3A, once the diffusion barrier is formed and an appropriate amount of barrier material exists on the bottoms of the vias, a metal conductive layer is deposited over the surface of the wafer such that the metal conductive layer is separated from the underlying metal layer by the small amount of barrier material at the bottom of the vias. See 310. FIGS. 3F and 3H depict substrate 302 after deposition of metal conductive layers 339 and 343, respectively. In these examples, the metal conductive layers are copper seed layers, but the invention is not limited to seed layers. Once the metal conductive layers are deposited, the process flow of FIG. 3A is done.

As illustrated in FIG. 3F and 3H, newly deposited metal conductive layers 339 and 343 are separated from underlying copper route 313 by regions of the diffusion barrier having minimal thickness. Preferably between about 25 and 300 Å are removed to provide this minimal thickness. Substrate 302 and 303 are now ready for bulk electrofill (or electroless metal deposition) for formation of conductive routes that will completely fill its surface features.

Diffusion barrier stack structures (bilayers, trilayers, etc.) can provide better protection against metal diffusion than single layers due to the combined properties of the individual layers of which they are made. In some cases, multi-layered diffusion barriers can also be made thicker to serve as a fill element. For example, in some low-k dielectric applications, lithography leaves the dielectric with undercuts (notches) or bowing (concavity) in the sidewalls. These defects can be repaired by deposition of extra barrier material that fills the defects. Judicious combinations of CVD, ALD and PVD methods are used to achieve this end.

EXPERIMENTAL

As mentioned, methods of the invention employ a simultaneous etch/deposition to etch barrier material at the via bottom while depositing barrier material elsewhere on a wafer substrate. As well, various aspects of process flows involve deposition of barrier materials (by ALD, CVD or PVD), precleaning, and degassing operations. In preferred embodiments all these process steps are done in the same processing tool. Tools that allow degas, ALD or CVD deposition, and PVD deposition all under the same vacuum are the INOVA and INOVA xT deposition systems available from Novellus Systems of San Jose, Calif. These system are comprised of processing modules, e.g. for Degas, Cool, Preclean, PVD, CVD or ALD processes, mounted to the same wafer handling module. Therefore, once a wafer is in the tool and a vacuum is established, all of the above described process aspects are performed without breaking vacuum. For example, a wafer is placed into the apparatus, it is degassed, cooled, and optionally precleaned (for example with an argon plasma). Then, a first deposited layer of barrier material is formed via PVD (e.g. tantalum nitride). Next, a tantalum simultaneous etch/deposition process is carried out which deposits the second portion of the diffusion barrier and etches at least the bottom of the via, forming the final diffusion barrier structure. Finally, a third layer of tantalum is deposited by PVD.

Preferably the simultaneous etch/deposition steps are carried out using a hollow cathode magnetron (HCM) sputtering module. Such devices are described in U.S. Pat. No. 5,482,611, naming Helmer et al. as inventors, U.S. Pat. Nos. 6,179,973 B1 and 6,193,854 B1, naming Lai et al. as inventors, and U.S. Pat. No. 6,217,716 B1 naming Lai as the inventor. Each of these patents is incorporated herein by reference for all purposes. If the barrier material to be deposited is tantalum or tantalum nitride, a tantalum target source is used.

In some embodiments, a suitable apparatus employs a magnetic array for generating a confined plasma of high ion density. The magnetic array may be implemented as one or more electromagnets, permanent magnets, or some combination of electromagnets and permanent magnets. The apparatus may include other magnets located proximate the substrate region for promoting process uniformity.

Figure 4:
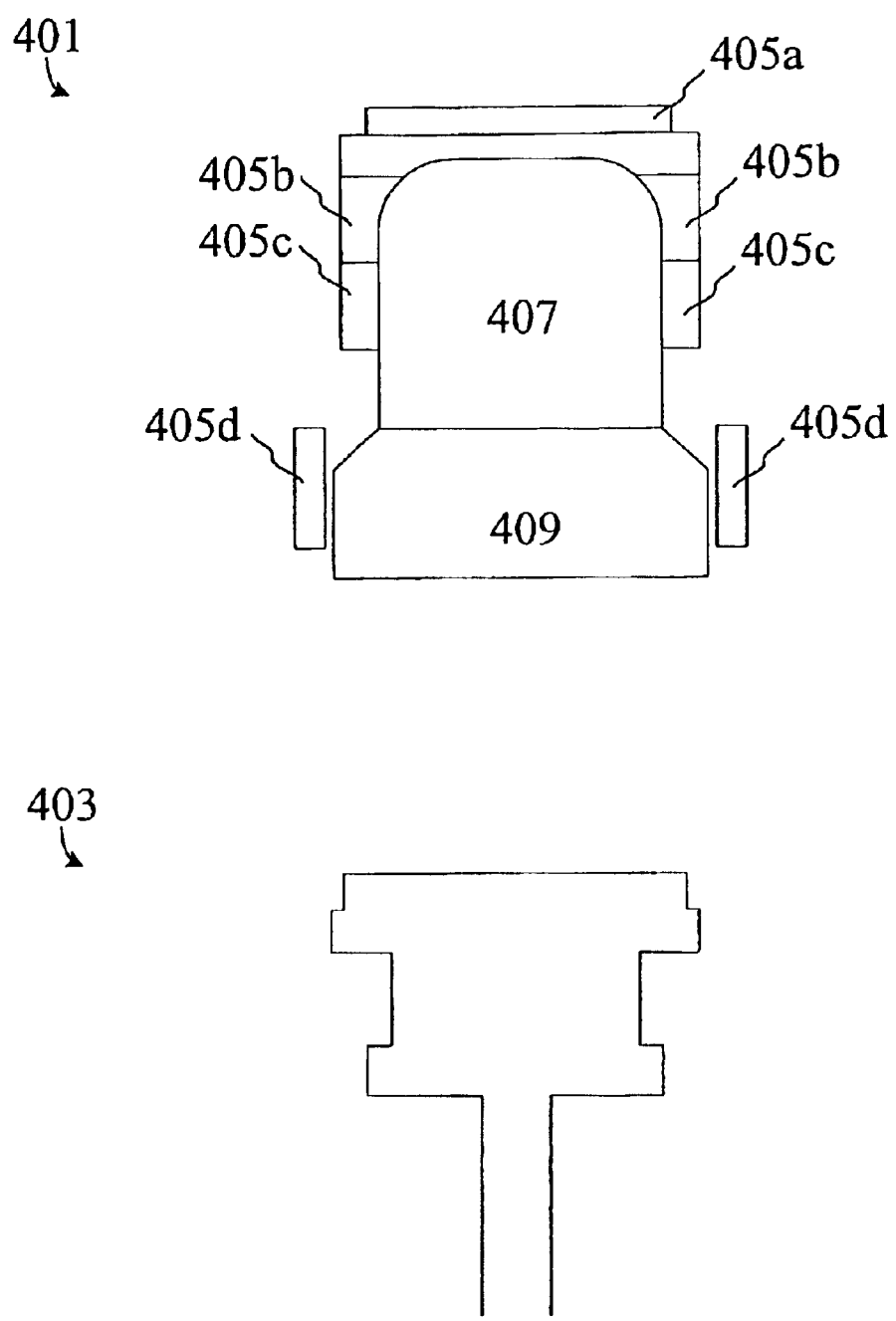
FIG. 4 is a cross-sectional depiction of the hollow cathode magnetron (HCM) apparatus suitable for practicing the current invention.

FIG. 4 presents a simple cross sectional view of one type of HCM sputtering apparatus that can be used in accordance with the invention. The HCM apparatus has two main components, the source 401, in which a plasma is created and maintained, and the RF bias electrostatic chuck (ESC) pedestal 403, which secures the wafer and applies an RF bias on the wafer, if needed. In this specific example, the source 401 contains four electromagnets 405a–405d, a cathode target 407 and an anode 409. The cathode target 407 generally has a hollow cup-like shape so that plasma formed in the source can be concentrated within this hollow region. The cathode target 407 also serves as a sputter target and is, therefore, made of a metal material such as tantalum, which is to be deposited onto a substrate.

An inert gas, such as argon, is introduced to into the hollow region of the cathode target 407 to form a plasma. An intense magnetic field is produced by electromagnets 405a–405d within the cathode target region. An additional four electromagnets are arranged downstream of the cathode target so that different currents can be applied to each electromagnet, thereby producing an ion flux and a controlled deposition and/or etch rate and uniformity. An anode 409, typically held at plasma floating potential, is used, in conjunction with the source electromagnets to shape the plasma distribution at the target mouth. The RF bias ESC pedestal 403 holds the wafer substrate in place and can apply a RF bias to the wafer substrate. The ion energy, and therefore the deposition and/or etch rate can also be controlled by the pedestal RF bias. An additional function of the ESC pedestal is to provide wafer temperature control during deposition and resputtering. Typically, argon backside gas is used to provide thermal coupling between the substrate and the ESC. In many cases, the ESC is cooled during deposition.

Generally, a plasma reactor that allows fine control of the plasma conditions can be tuned to provide the E/D variations over substrate topology as desired for certain embodiments this invention. The INOVA HCM reactors provided by Novellus Systems have eight or more separate electromagnetic coils. Each of these, and particularly those located near the substrate, can be independently controlled to fine tune the E/D profile from via bottom to field region and from the center to edge across of the wafer.

Preferred process conditions include a pressure of between about 0.1 and 100 m Torr. Argon process flows are between about 50 and 300 SCCM (standard cubic centimeters per minute). When E/D>1 is desired both at the bottom of the vias and in the field, a DC source power of between about 1 and 10 kW is applied to the tantalum target. The electromagnet coil currents used are between about 0–10 A. The current polarity and current levels are optimized to obtain uniform deposition and resputter across the wafer surface, as well as to maximize utilization of the target.

The wafer temperature is manipulated using a temperature controlled stage, the wafer temperatures used are between about −100 and 100° C., preferably about −20° C. The wafer is biased with an RF frequency source located below or in proximity to the stage. The RF power applied is preferably between about 100 and 2000 W. In preferred embodiments, the amount of sputtering is controlled by the RF power at fixed RF frequency. Various RF frequencies can be used to achieve this effect. One preferred RF frequency is 13.56 MHz.

In general, etch rate is most strongly related to the RF power, while the deposition rate is most strongly related to the DC source power. The E/D ratio depends predominantly on the ratio of RF power (table) to DC power (source). Higher RF/DC power ratios correspond to higher the E/D ratios on the wafer. The etch rate is largely dependent on RF power and pressure since these parameters control the energy of argon ions near the wafer. The deposition rate is largely dependent on DC power since this parameter affects the flux and energy of argon ions near the surface target.

Controlling the plasma potential and the DC bias on the wafer can provide the etch conditions required for this invention. The energy of the argon ions, and therefore the etch rate, is proportional to the difference between plasma potential and wafer potential. The deposition rate during re-sputtering is proportional to the DC power applied to the HCM target. However, the deposition rate in the trench and via is reduced due to the off-normal component of the material (tantalum) flux. The etch rate at the trench and via bottom is almost independent on the feature geometry due to the high directionality of argon ion flux. These effects lead to the following E/D relationships during the resputter step: E/D (via bottom)>E/D (trench bottom)>E/D (field)>E/D (sidewall). On the sidewall, E~0, resulting in net deposition. Thus, the etch/deposition ratio (E/D) can be controlled so that it is <1 in the via bottom and (resulting in a net etching), and >1 or <1 on the trench and field horizontal surfaces. The magnitude of E/D on the side walls is <1 because the plasma flux is directed primarily toward the wafer surface (parallel with the side walls). Thus, only horizontal surfaces (with relatively large surface areas (compared to the side walls)) are effectively etched by the impinging plasma flux. The sidewalls receive a net deposition.

If tantalum nitride or nitrogen-doped tantalum is the barrier material to be deposited, a nitrogen source such as $N_2$ will be used at 5–100 SCCM, preferably about 10–50 SCCM in conjunction with argon. Titanium silicon nitride is deposited by CVD using a technique described in U.S. patent application Ser. No. 09/965,471, entitled "Method of Depositing a Diffusion Barrier for Copper Interconnection Applications" filed by Suwwan de Felipe on the same date as this application, or U.S. patent application Ser. No. 09/862,539, titled "Improved Deposition of Conformal Copper Seed Layers by Control of Barrier Layer Morphology" filed by Suwwan de Felipe on May 21, 2001.

As mentioned, methods of the invention form bilayered or trilayered diffusion barriers in unlanded via structures. Illustrative structures of diffusion barriers of the invention were described above with reference to the figures. The table below summarizes further aspects of some preferred embodiments of the invention. Each of the thirteen listed diffusion barriers may vary according to the particular thickness of the deposited layers, and whether or not material is deposited only on the side walls or on the side walls and the field and horizontal trench regions during the simultaneous etch deposition (E/D) process step. Therefore this table is meant to emphasize some preferred stack compositions as well as particular methods used to form them. The symbol "Ta(N)" is meant to designate tantalum with some nitrogen content. This can be nitrogen-doped tantalum, solid solutions (interstitial forms) of tantalum and nitrogen, or tantalum nitrides. Titanium silicon nitride is designated by "TiN(Si)." Note that all examples listed in table below provide some minimal barrier coverage at via bottom and avoid the above-described problems of copper on copper contact.

TABLE

Exemplary Diffusion Barriers of the Invention.

| Diffusion Barrier | Pre-clean | Barrier Material 1 (303) | Barrier Material 2 (305) | Barrier Material 3 (307) | Barrier Material 4 (308) |
|---|---|---|---|---|---|
| 1 | yes | HCM Ta(N) | Ta E/D etch partial | — | — |
| 2 | yes | HCM Ta(N) | Ta E/D etch through | HCM Ta(N) | |
| 3 | yes | HCM Ta(N) | Ta E/D etch through | HCM Ta(N) | Ta E/D etch partial |
| 4 | yes | CVD TiN(Si) | Ta E/D etch partial | | |
| 5 | yes | CVD TiN(Si) | Ta E/D etch through | HCM Ta(N) | |
| 6 | yes | CVD TiN(Si) | Ta E/D etch through | HCM Ta(N) | Ta E/D etch partial |
| 7 | no | HCM Ta(N) | Ta E/D etch through | HCM Ta(N) | |
| 8 | no | HCM Ta(N) | Ta E/D etch through | HCM Ta(N) | Ta E/D etch partial |
| 9 | no | CVD TiN(Si) | Ta E/D etch through | HCM Ta(N) | |
| 10 | no | CVD TiN(Si) | Ta E/D etch through | HCM Ta(N) | Ta E/D etch partial |
| 11 | no | HCM Ta(N) | Ta E/D etch through | CVD TiN(Si) | |
| 12 | no | HCM Ta(N) | Ta E/D etch through | ALD Ta(N) | |
| 13 | no | ALD Ta(N) | Ta E/D etch through | HCM Ta | |

Note that in the above examples, the simultaneous etch/deposition operation (Barrier Material 2) is presented as a metallic tantalum deposition (as opposed to a nitride deposition). In some embodiments of the invention, the etch/deposition operation may be conducted in a nitrogen-containing atmosphere to form a nitride (of tantalum or other metal). Generally, the processes of this invention allow for deposition in which any combination of metallic materials, nitrides, or other compositions (metal silicon nitrides) are deposited in the three or four barrier material deposition operations.

Figure 5:
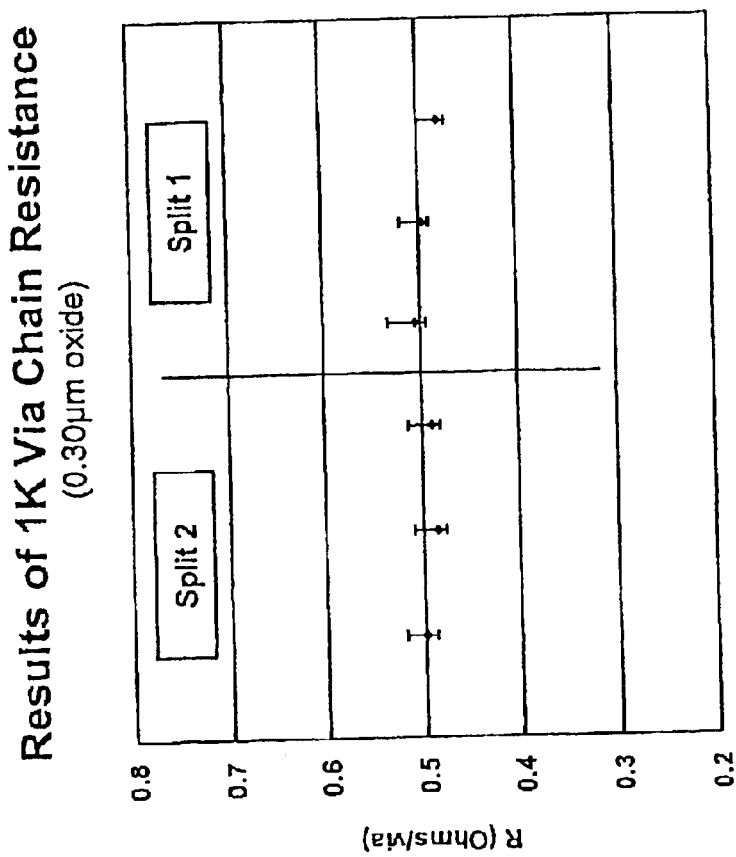
FIG. 5 represents experimental data showing resistance data from wafer samples run with and without separate preclean steps.
Figure 6:
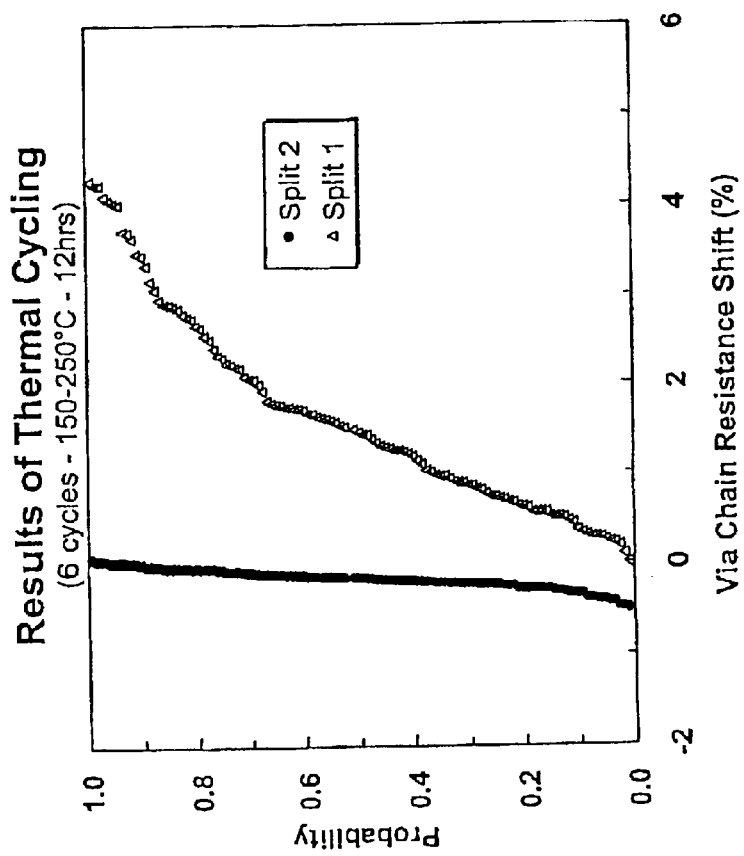
FIG. 6 represents experimental data showing stress migration data from wafer samples run with and without separate preclean steps.

As mentioned previously, in preferred embodiments of the invention, some of the processes of this invention are performed without using a preclean step prior to deposition the first portion of the diffusion barrier (FIG. 3A, process block 303). It is noteworthy to point out that the elimination of the separate preclean is contrary to previous typical methods. As discussed previously, traditionally, the preclean typically involves an argon sputter etch or reactive sputter to remove contaminants such as copper oxide and residues from etch and photoresist processes. However, experimental evidence in accordance with the present invention show that process steps described in the present invention can sufficiently clean the substrate surface and that a separate preclean step is not necessary, and may even be detrimental. FIGS. 5 and 6 show experimental data to support these claims.

FIG. 5 shows electrical resistance of a 1000-via chain with 0.3 micron width. The resistance values are shown for two different process splits. Split 1, the control group, was treated with a standard preclean step, which involves the equivalent of about 100 angstroms oxide removal. Split 2 was run without a preclean process. In both splits, degas steps using 40 seconds of degas step at 350 degrees Celsius were implemented. Barrier layers in both splits were processed using the following: 100 Å HCM TaN deposition, 150 Å re-sputtering (via bottom etched through), 250 Å HCM Ta deposition, 125 Å re-sputtering (via bottom partially etched). Also in both splits, 800 Å of copper seed was deposited over the barrier layers. Data from three wafers of each split were measured.

As shown by FIG. 5, split 1 (right side of graph) and split 2 (left side of graph) exhibit similar via chain resistance values (about 0.5 Ohms/via) and distribution of resistance values. Therefore, one could speculate that the barrier process was sufficient in cleaning the via bottoms such that the separate preclean step can be eliminated.

FIG. 6 shows results from a stress migration test of the same two splits used in FIG. 5. Stress migration is a measurement of the shift in via or chain resistance after thermally cycling the wafer between certain temperatures over a specified time period. In this experiment, the wafers underwent six thermal cycles between 150 and 250 degrees Celsius for a period of twelve hours. FIG. 6 shows the probability (vertical axis) of via chain resistance shifts (in %) for each of the splits. Data from split 1 (precleaned) is represented with triangle symbols while data from split 2 (not precleaned) is represented with solid circle symbols.

In FIG. 6, split 1 results show a significant shift in via chain resistance while split 2 results show substantially no shift in via chain resistance. These results indicate that the split 2, the wafers processed without using a separate preclean step, actually show better stress migration results and are, therefore, more reliable.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method for depositing a diffusion barrier and a metal conductive layer for metal interconnects on a wafer substrate, the method comprising:
   (a) depositing a first portion of the diffusion barrier over the surface of the wafer substrate;
   (b) etching through at least part of the first portion of the diffusion barrier at the bottoms of a plurality of vias to expose at least part of an underlying metal layer while simultaneously depositing a second portion of the diffusion barrier on at least field regions of the wafer substrate;
   (c) depositing a third portion of the diffusion barrier, which covers at least the bottoms of the vias; and
   (d) depositing the metal conductive layer over the surface of the wafer substrate.

2. The method of claim 1, wherein the method does not employ a precleaning operation prior to (a).

3. The method of claim 1, wherein at least some of the plurality of vias are unlanded vias.

4. The method of claim 1, wherein at least two successive operations in (a) through (c) are performed in the same processing chamber.

5. The method of claim 4, wherein the processing chamber is a plasma physical vapor deposition (PVD) chamber.

6. The method of claim 4, wherein the processing chamber comprises a hollow cathode magnetron.

7. The method of claim 1, further comprising a degas operation prior to (a).

8. The method of claim 7, wherein the wafer substrate is degassed by heating the wafer to between about 150 to 400 degrees Celsius.

9. The method of claim 1, wherein (a) comprises depositing the first portion of diffusion barrier to a thickness of between about 10 and 400 angstroms over field regions on the surface of the wafer substrate.

10. The method of claim 1, wherein (a) comprises depositing the first portion of diffusion barrier to a thickness of between about 50 and 200 angstroms on field regions of the wafer substrate.

11. The method of claim 1, wherein (b) comprises depositing the second portion of diffusion barrier elsewhere on the wafer to between about 25 and 100 Å at least as on sidewalls of the plurality of vias.

12. The method of claim 11, wherein (b) further comprises depositing the second portion of diffusion barrier elsewhere on the wafer to between about 50 and 500 Å on field regions of the wafer substrate and a plurality of horizontal trench surfaces of the wafer substrate.

13. The method of claim 1, wherein (c) comprises depositing the third portion of diffusion barrier to between about 10 and 400 Å on field regions of the wafer substrate.

14. The method of claim 1, wherein (c) comprises depositing the third portion of diffusion barrier to between about 50 and 200 Å on field regions of the wafer substrate.

15. The method of claim 1, wherein (c) comprises depositing the third portion of diffusion barrier to between about 10 and 50 Å on bottoms of the plurality of vias.

16. The method of claim 1, wherein (a) comprises sputtering a metal from a target having an applied DC power of between about 10 and 50 kilowatts, without significantly biasing the wafer substrate.

17. The method of claim 1, wherein (a) comprises using chemical vapor deposition (CVD), physical vapor deposition (PVD), or atomic layer deposition (ALD).

18. The method of claim 1, wherein at least one portion of the diffusion barrier comprises a material selected from the group consisting of tantalum, nitrogen-doped tantalum, tantalum nitride, titanium nitride, tungsten nitride and silicon containing versions of any of these.

19. The method of claim 1, wherein (b) comprises sputtering a metal from a target having an applied DC power of between about 1 and 30 kilo Watts, while applying a bias to the wafer substrate.

20. The method of claim 19, wherein the bias comprises RF power of between about 100 and 2000 Watts.

21. The method of claim 19, wherein (b) further comprises passing argon gas through the process chamber at a flow rate of between about 10 and 300 sccm.

22. The method of claim 1, wherein (b) is performed under conditions having an etch-to-deposition ratio of greater than 1 at the bottoms of the vias.

23. The method of claim 1, wherein (c) comprises sputtering a metal from a target having an applied DC power of between about 10 and 50 kilo Watts, without significantly biasing the wafer substrate.

24. The method of claim 1, wherein (c) comprises a process selected from the group consisting of chemical vapor deposition (CVD), physical vapor deposition (PVD), and atomic layer deposition (ALD).

25. The method of claim 1, further comprising, after (c) but prior to (d), etching through some of the third portion of the diffusion barrier at the bottoms of a plurality of vias, without etching to expose an underlying metal structure.

26. The method of claim 1, wherein (d) comprises depositing copper containing metal over the surface of the wafer substrate.

27. The method of claim 26, wherein the metal is a copper seed layer.

28. The method of claim 1, wherein at least (a) and (b) are performed in the same processing chamber.

29. The method of claim 1, wherein at least (b) and (c) are performed in the same processing chamber.

30. The method of claim 1, wherein at least (a) through (c) are all performed in the same processing chamber.

31. A method for depositing a diffusion barrier and a metal conductive layer on a partially fabricated integrated circuit containing a plurality of unlanded vias, the method comprising:

(a) depositing a first portion of the diffusion barrier on the surface of the partially fabricated integrated circuit;

(b) etching through at least part of the first portion of the diffusion barrier at the bottoms of a plurality of unlanded and landed vias to expose at least part of an underlying metal layer while simultaneously depositing a second portion of the diffusion barrier on at least field regions of the surface of the partially fabricated integrated circuit;

(c) depositing a third portion of the diffusion barrier, which covers at least the bottoms of the vias; and (d) depositing the metal conductive layer over the surface of the wafer substrate.

32. The method of claim 31, wherein method does not employ a precleaning operation prior to (a).

33. The method of claim 31, further comprising a degas operation prior to (a).

34. The method of claim 31, wherein at least two successive operations of (a), (b), and (c) are performed in the same processing chamber.

35. The method of claim 34, wherein the processing chamber is a plasma physical vapor deposition (PVD) chamber.

36. The method of claim 34, wherein the processing chamber comprises a hollow cathode magnetron.

37. The method of claim 31, wherein (a) and/or (c) comprise a processes selected from the group consisting of chemical vapor deposition (CVD), physical vapor deposition (PVD), and atomic layer deposition (ALD).

38. The method of claim 31, wherein at least one portion of the diffusion barrier comprises a material selected from the group consisting of tantalum, nitrogen-doped tantalum, tantalum nitride, titanium nitride, tungsten nitride and silicon containing versions of any of these.

39. The method of claim 31, wherein (b) comprises sputtering a metal from a target having an applied DC power of between about 1 and 30 kilo Watts, while applying a bias to the wafer substrate.

40. The method of claim 31, wherein (d) comprises depositing copper-containing metal over the surface partially fabricated integrated circuit.

41. The method of claim 40, wherein the metal is a copper seed layer.

42. The method of claim 31, wherein at least (a) and (b) are performed in the same processing chamber.

43. The method of claim 31, wherein at least (b) and (c) are performed in the same processing chamber.

44. The method of claim 31, wherein at least (a) through (c) are all performed in the same processing chamber.

* * * * *